United States Patent
Bietry et al.

[11] Patent Number: 6,075,656
[45] Date of Patent: Jun. 13, 2000

[54] HIGH NUMERICAL APERTURE OBJECTIVE LENS

[75] Inventors: Joseph R. Bietry, Rochester; Phillip D. Bourdage, Penfield; Paul O. McLaughlin; David A. Richards, both of Rochester, all of N.Y.

[73] Assignee: Eastman Kodak Company, Rochester, N.Y.

[21] Appl. No.: 09/188,420

[22] Filed: Nov. 9, 1998

[51] Int. Cl.[7] .............................. G02B 3/02; G02B 9/00; G02B 9/06

[52] U.S. Cl. ..................... 359/717; 359/708; 359/719; 359/754; 359/794

[58] Field of Search ........................ 359/708, 709, 359/717, 719, 754, 794; 369/100, 112; 235/454, 462.11, 462.35

[56] References Cited

U.S. PATENT DOCUMENTS

| | | | |
|---|---|---|---|
| 4,525,040 | 6/1985 | Nakamura | 350/480 |
| 4,645,311 | 2/1987 | Rothe | 350/432 |
| 4,953,959 | 9/1990 | Ishiwata et al. | 350/432 |
| 5,166,830 | 11/1992 | Ishibai et al. | 359/71 |
| 5,880,893 | 3/1999 | Suganuma | 357/717 |

*Primary Examiner*—Georgia Epps
*Assistant Examiner*—David N. Spector
*Attorney, Agent, or Firm*—Svetlana Z. Short

[57] ABSTRACT

A high numerical aperture objective lens for focusing a laser beam consists of a first lens element of positive optical power intercepting the laser beam and a second lens element of positive optical power located adjacent to the first lens element. The first lens element and the second lens element have identical surface profiles.

29 Claims, 5 Drawing Sheets

HIGH NUMERICAL APERTURE OBJECTIVE LENS

FIELD OF THE INVENTION

This invention relates to objective lenses with high numerical apertures. More specifically, it relates to high numerical aperture objective lenses suitable for use in laser disk writers and readers, laser diode collimators, couplers from laser diodes to optical fibers, and other similar applications.

BACKGROUND OF THE INVENTION

The numerical aperture (NA) of an objective lens is defined as NA=n sin(θ), where n is the index of refraction of the image space and θ is the angle of the axial marginal ray (the highest ray entering the objective lens parallel to the optical axis) at the image space. Image space is defined by the location of the image surface. Thus, the numerical aperture can be increased by either increasing the angle θ or by immersing an image surface in a higher index medium, thereby increasing the index of refraction of the image space.

If the image space is in air (n=1), the greatest theoretically achievable NA is 1. Single element objective lenses that utilize aspheric surfaces and high index glasses can achieve numerical apertures of approximately 0.55. However, when the numerical apertures becomes larger than 0.55, optical aberrations introduced by the lens element become too great for the objective lens to be usable at such numerical apertures. Because of this problem, objective lenses with high numerical apertures (i.e., numerical apertures greater than 0.55) are constructed of two or more lens elements.

Two element high numerical aperture objective lenses have been shown to produce numerical apertures of over 0.7 and as large as 0.85. Such a high numerical aperture objective lens is illustrated in FIG. 1 and is disclosed in the article entitled "A Rewritable Optical Disk System with Over 10 GB of Capacity" by Kiayoshi Osato, Kenji Yamamoto, Isao Ichimura, Fumisada Maeda and Yataka Kasami. However, two element high numerical aperture objective lenses, such as the optical disk system of this article, are expensive to manufacture because all four lens surfaces have a different shape. These high numerical aperture objective lenses require unique manufacturing and measuring tools for every surface. In addition, during assembly of such objective lenses both kinds of lens elements need to be inventoried. Furthermore, the positions of the lens elements can not be reversed, making the assembly of such objective lenses relatively difficult and expensive.

SUMMARY OF THE INVENTION

According to the present invention, a high numerical aperture objective lens for focusing a laser beam consists of a first lens element of positive optical power intercepting the laser beam and a second lens element of positive optical power located adjacent to the first lens element. The first lens element and the second lens element have identical surface profiles.

DETAILED DESCRIPTION OF THE PREFERRED EMBODIMENTS

Figure 1:
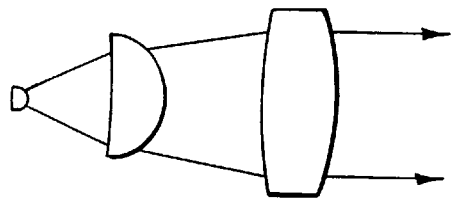
FIG. 1 illustrates a prior art laser diode collimator.
Figure 2:
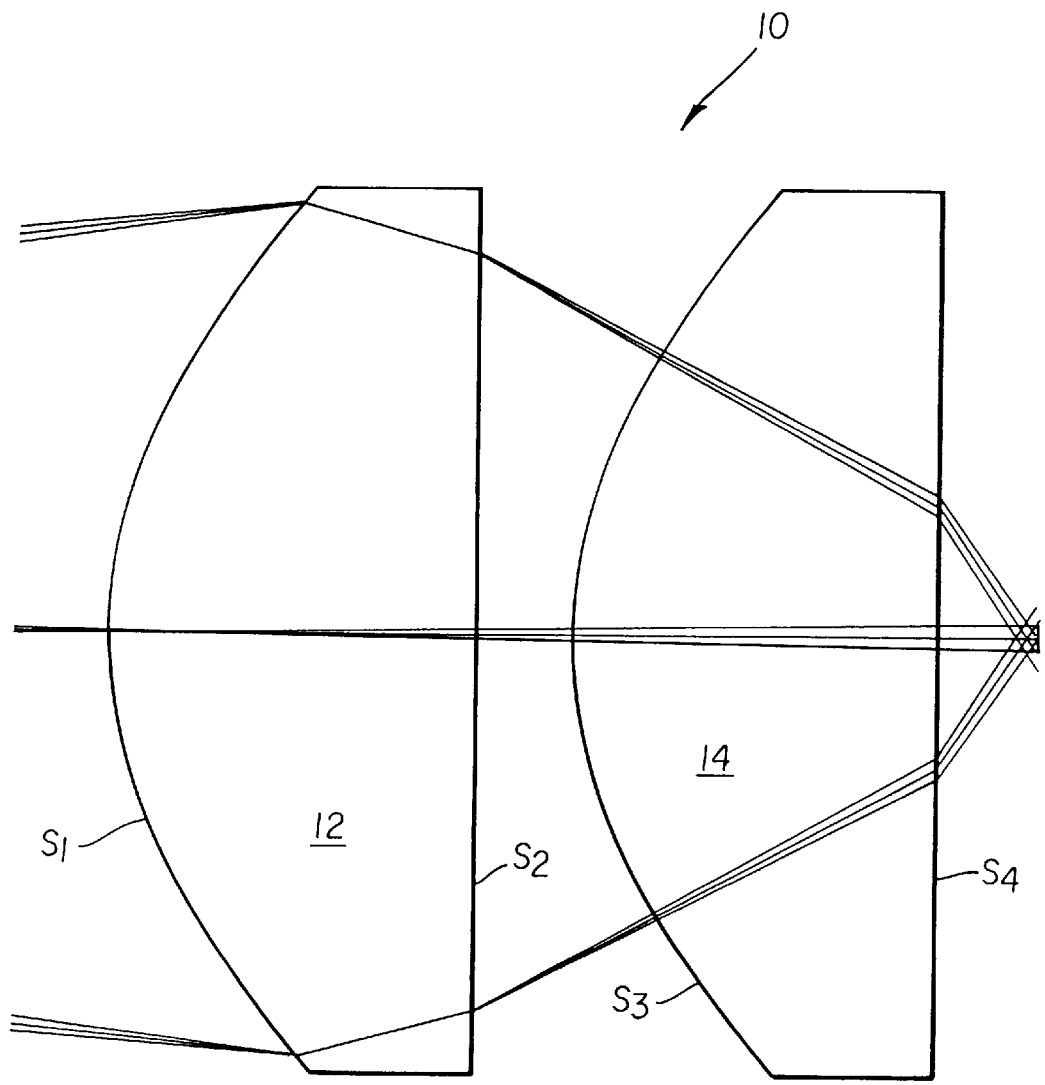
FIG. 2 illustrates a high numerical aperture objective lens of the first embodiment of the present invention.

Referring to FIG. 2, a high numerical aperture objective lens 10 consists of two lens elements 12 and 14. It is preferred that the index of refraction for these lens elements be 1.7 or higher. This is because higher index of refraction makes it easier to achieve higher numerical apertures. Elements 12 and 14 are located close to one another and, in combination, provide the objective lens 10 with a numerical aperture of 0.83. Lens elements 12 and 14 of the objective lens 10 are identical. The objective lens 10 is illustrated in FIG. 2 and its parameters are provided in Tables 1A and 1B. In this and other similar tables N is the index of refraction of the lens element, and all linear dimensions except for the wavelength $\lambda_i$ are provided in millimeters.

TABLE 1A

| Surface | Radius | Spacing | Material |
|---|---|---|---|
| $S_0$ | Object | 1.02056 | Air |
| $S_1$ ASPH | 0.1511 | 0.11 | TAC4 |
| $S_2$ | Infinity | 0.029435 | Air |
| $S_3$ ASPH | 0.1511 | 0.11 | TAC4 |
| $S_4$ | Infinity | 0.03 | Air |
| $S_5$ | Image | | Air |

TABLE 1B

| Surf | K | AD | AE | AF | AG |
|---|---|---|---|---|---|
| $S_1$ | 0 | −0.329875e+2 | −0.71402e+3 | −0.582805e+4 | −0.31375e+7 |
| $S_3$ | 0 | −0.329875e+2 | −0.71402e+3 | −0.582805e+4 | −0.31375e+7 |
| Wavelength | | $\lambda_1$ = 670 nm | $\lambda_2$ = 660 nm | $\lambda_3$ = 650 nm | |
| N | | 1.722924 | 1.723447 | 1.723993 | |

In this embodiment, the front most lens surface $S_1$ (i.e., the surface facing a light source such as a laser diode or an opening of an optical fiber) is convex and the other lens surface is piano. The piano surface makes the lens elements inexpensive to manufacture because the centers of the two surfaces $S_1$ and $S_2$, $S_3$ and $S_4$ do not have to be aligned. The convex surfaces $S_1$, $S_3$ of the lens elements 12 and 14 are aspheric. The aspheric equation describing these aspheric surfaces is:

$$X = \frac{CY^2}{1+\sqrt{1-(K+1)C^2Y^2}} + ADY^4 + AEY^6 + AFY^8 + AGY^{10} + \ldots \text{where:}$$

X is the distance along the optical axis OA;
Y is the height from the optical axis;
C is the reciprocal of the vertex radius of curvature of the curved lens surface;
K is the conic coefficient; and
AD through AK are aspheric coefficients of $4^{th}$, $6^{th}$, $8^{th}$, $10^{th}$, etc., order. The value of the aspheric coefficients for the various aspheric lens surfaces for the two objective lens 10 are provided in Table 1B.

Figure 3A:
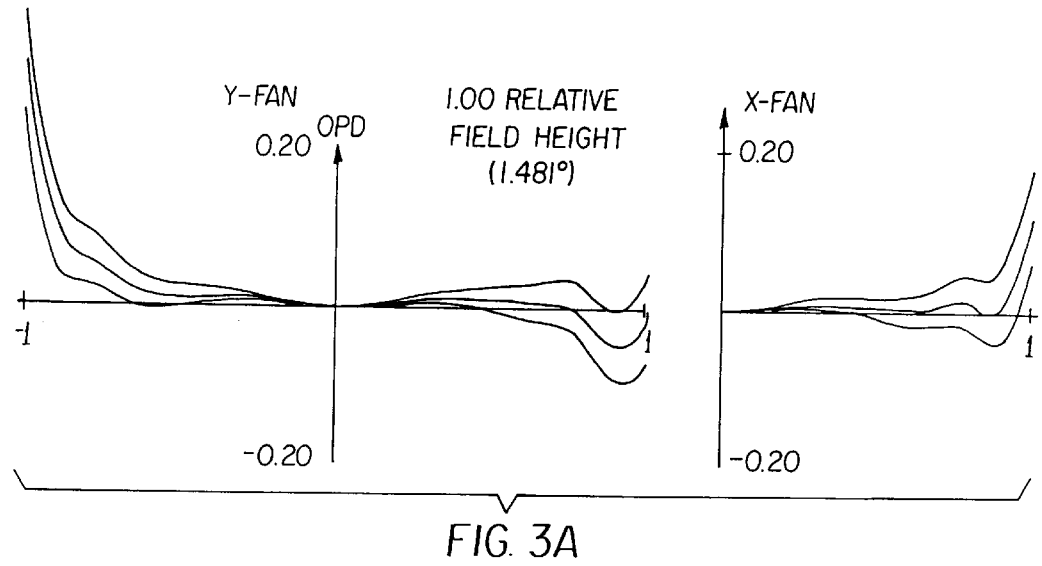
FIG. 3A is a ray intercept plot for the a high numerical aperture objective lens of FIG. 2 at a full field of view.
Figure 3B:
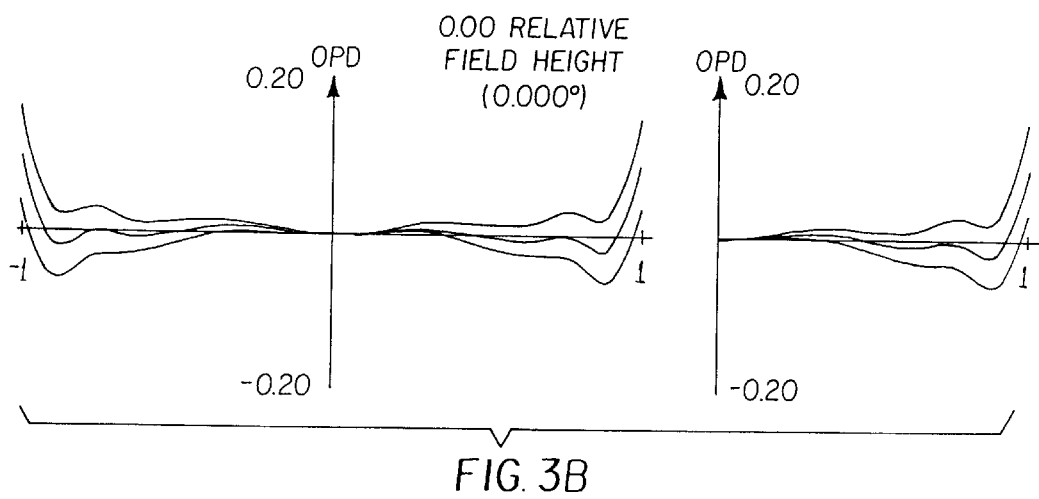
FIG. 3B is a ray intercept plot for the a high numerical aperture objective lens of FIG. 2 at a 0.0 degree field of view.

The asphericity of surfaces $S_1$ and $S_3$ corrects for spherical aberration. The performance of the high numerical aperture objective lens 10 is provided in Table 1C and is illustrated in FIGS. 3A and 3B.

TABLE 1C

| Wavelength | 670 nm | 660 nm | 650 nm |
|---|---|---|---|
| Weights | 1 | 1 | 1 |
| Field | | RMS* | |
| 0.00° | | 0.018 | |
| 1.48° | | 0.031 | |

*Units of RMS are waves at 660 nm.

Figure 4:
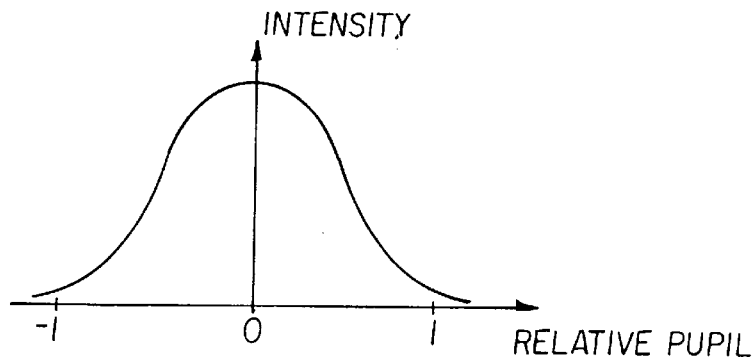
FIG. 4 illustrates an intensity profile of a light beam with a gaussian intensity distribution.

More specifically, Table 1C lists a heterochromatic RMS (Root Mean Square) wavefront error at two image positions, on axis and at full field. The performance of this objective lens is excellent; the objective lens 10 is diffraction limited and its RMS wavefront error is less than one tenth of the wavelength of interest. This conclusion is supported by FIGS. 3A and 3B which illustrate (for an axis and full field positions) optical path differences (OPD) along the y axis as a function of relative pupil height (x axis). FIGS. 3A and 3B show that the maximum optical path difference is about 0.1 waves across the central portion of the pupil. Because the laser beam has a gaussian intensity distribution, as shown in FIG. 4, most of the light energy is concentrated in this central portion.

Lens elements 12 and 14 are made from optically transparent glass TAC4. This glass transmits visible as well as near infra red light (700–1300 nm). Therefore, objective lens 10 would be suitable (with slight change in the surface profiles of lens surfaces $S_1$ and $S_3$) for use with laser light at these wavelengths. Although the two lens elements of FIG. 2 are made from the same optical material, they do not have to be. For example, they can be made by the same mold using two types of optical glass or plastic. However, if the lens elements are identical, manufacturing and assembly costs are minimized. First, assembly of lens elements is simplified because if the locations of the lens elements are reversed the performance of the system is maintained. Otherwise, reversing the locations of the two elements will degrade the performance of the objective lens. Secondly, a single mold can be used to manufacture the lens elements without the need to stop manufacture of one of the elements in order to make the other lens element.

Figure 5:
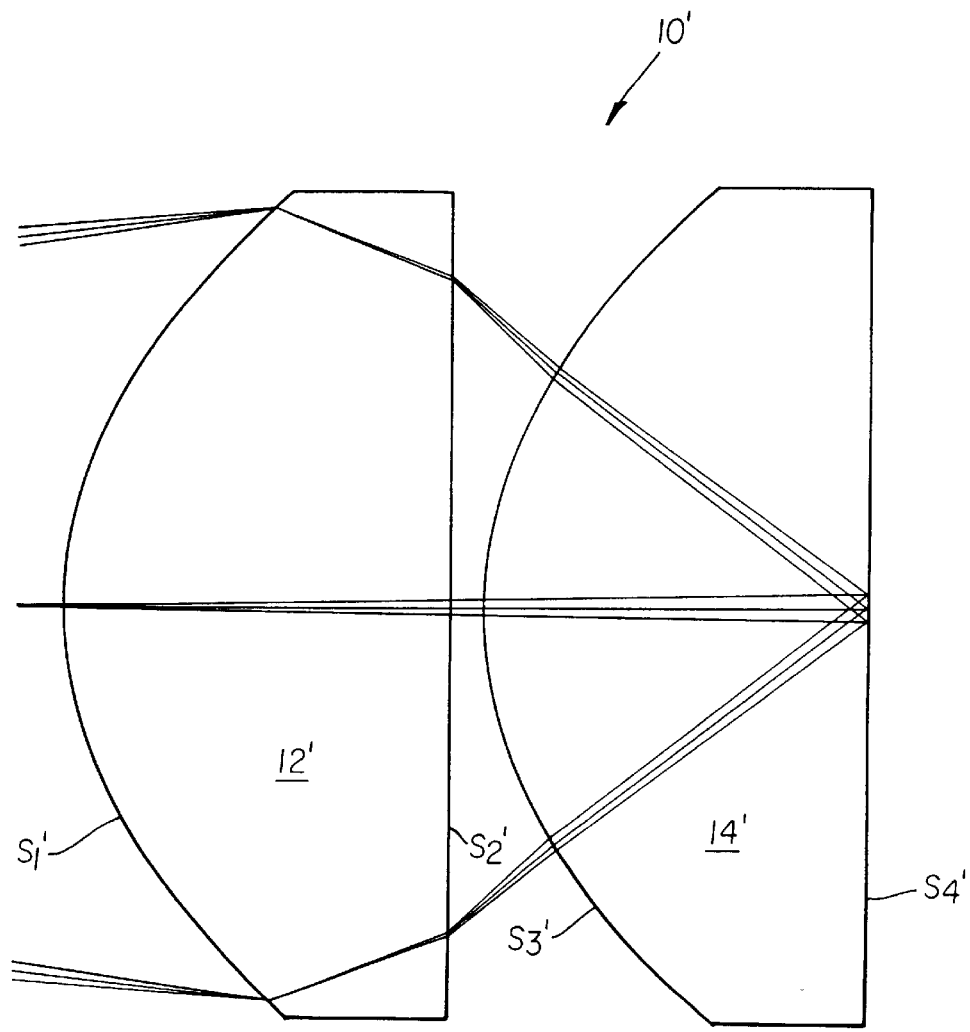
FIG. 5 illustrates a high numerical aperture objective lens of the second embodiment of the present invention.

If one requires a numerical aperture that is greater than 1, it is necessary to immerse the image space in a medium with an index of refraction greater than 1. An objective lens 10' of a second embodiment of the present invention is designed to provide such a numerical aperture. This objective lens 10' is illustrated in FIG. 5. This objective lens 10' is similar to the objective lens 10 and utilizes two identical lens elements 12' and 14', but provides the image on an image plane that is located on the back surface of the second lens element 14', within the index of that lens element. Because the image is located within the optical material, very close to the glass-air interface, the light energy extends a very short distance beyond the lens element's surface $S_4'$. This is light energy called an evanescent wave. This light energy can be optically coupled to a high density optical recording medium located very close to the lens element's surface, making this objective lens 10' especially suitable for use in laser readers and laser writers. (Optical coupling is a minimum loss light energy transfer from one location to another location.) Because the light energy extends only over a very short distance beyond the lens element's surface $S_4'$, the quality of optical coupling (of the evanescent waves) rapidly deteriorates with the increased distance between the lens surface and the optical recording medium. Thus, in order for this coupling to be effective, the distance between the optical recording medium and the surface $S_4'$ should be less than about 0.5 $\lambda$ and preferably less than about 0.3 $\lambda$, where $\lambda$ is the wavelength of interest. Therefore, if $\lambda \approx 600$ nm it is preferred that distance between the optical recording medium and the surface $S_4'$ be about 10 nm to about 200 nm. The term "high density optical recording medium" means an optical recording medium with a density greater than 5 Gigabits per square inch and, preferably, greater than 10 Gigabits per square inch.

The objective lens 10' has a numerical aperture NA of 1.10. The index of refraction for the lens elements 12' and 14' is 1.836 at the wavelength of 660 nanometers. The optical material (SF57) transmits visible as well as the near infra red light (700–1300 nm). Therefore, the objective lens system 10' would be suitable (with slight change in the surface profiles of lens surfaces $S_1'$ and $S_3'$) for use with laser light at these wavelengths. The specific parameters of this objective lens are provided in Tables 2A and 2B.

TABLE 2A

| Surface | Radius | Spacing | Material |
|---|---|---|---|
| | Object | 0.8889 | Air |
| $S_1'$ ASPH | 0.12508 | 0.11 | SF57 |
| $S_2'$ | Infinity | 0.01 | Air |
| $S_3'$ ASPH | 0.12508 | 0.1100 | SF57 |
| $S_4'$ | Infinity | 0.0000 | Air |
| | Image | | Air |

TABLE 2B

| Surf | K | AD | AE | AF | AG |
|---|---|---|---|---|---|
| $S_1'$ | 0 | 0.806104e+2 | −0.32853e+5 | 0.315073e+7 | −0.126528e+9 |
| $S_3'$ | 0 | 0.806104e+2 | −0.32853e+5 | 0.315073e+7 | −0.126528e+9 |

Figure 6A:
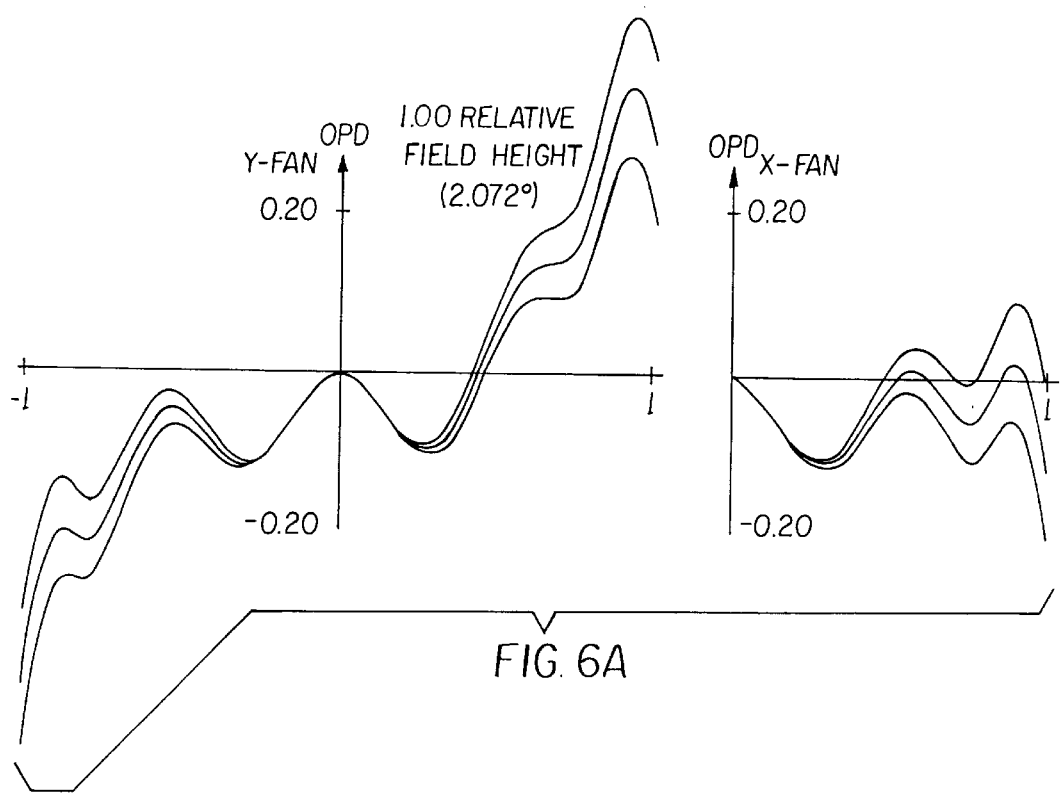
FIG. 6A is a ray intercept plot for a high numerical aperture objective lens of FIG. 5 at a full field of view.
Figure 6B:
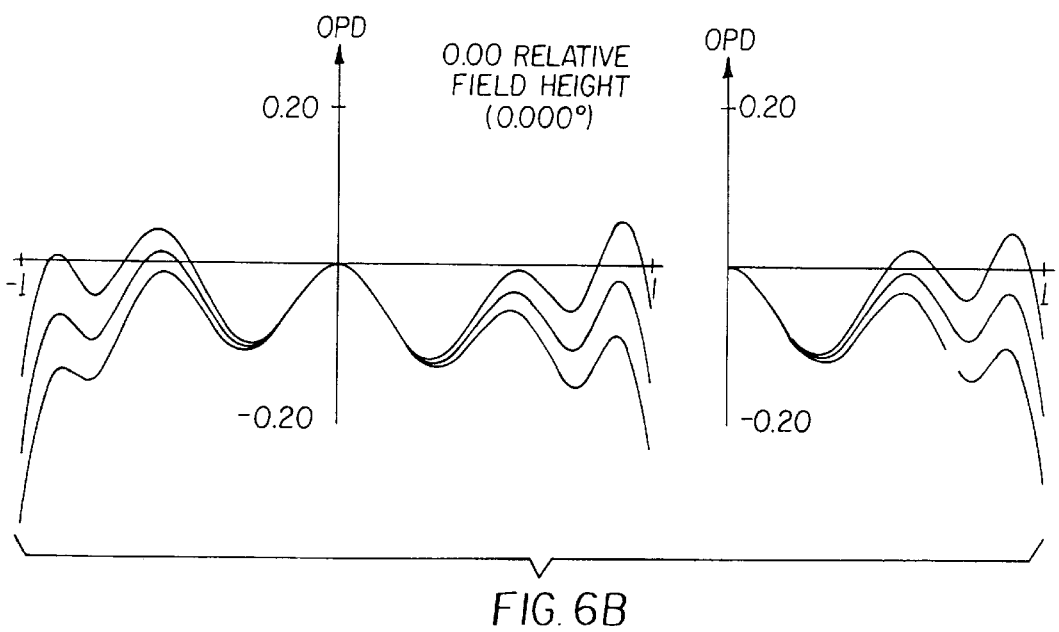
FIG. 6B is a ray intercept plot for a high numerical aperture objective lens of FIG. 5 at 0.0 degree field of view.

The performance of the second embodiment 10' is excellent as shown in Table 2C. FIGS. 6A and 6B show that the maximum optical path difference is about 0.1 wave across the central portion of the pupil.

TABLE 2C

| Wavelength | 670 nm | 660 nm | 650 nm |
|---|---|---|---|
| Weights | 1 | 1 | 1 |
| Field | | RMS* | |
| 0.0° | | 0.024 | |
| 2.07° | | 0.028 | |

*Units of RMS are waves at 660 nm.

The high numerical aperture objective lenses 10 and 10' of the first and second embodiments are very small and that the lenses 12, 14, 12' and 14' have clear aperture diameters that are less than 1.0 millimeters and, more specifically, are on the order of 0.3 millimeters. Because the lens elements are so small, the objective lenses 10 and 10' are uniquely suitable for use in optical and data communications and for use in optical microelectromechanical structures (MEMs). Another unusual feature of the objective lenses 10 and 10' of the two embodiments of the present invention is that the aspheric surfaces are characterized by the aspheric coefficients with positive exponents (i.e., the exponents are larger than zero). The aspheric surfaces characterized by such aspheric coefficients greatly improve the performance of the small objective lenses with high numerical apertures.

In both embodiments the two lens elements comprising the objective lenses are identical to each other in all respects (surface shape, center thickness, and glass types). With this approach only a single lens element needs to be manufactured. Two replicas of the same lens element are than stacked together to produce a high NA objective. One advantage of such objective lenses is that they provide high performance at large numerical apertures while being relatively simple and inexpensive to make. Additionally, as stated above, the second surface of both elements 12 and 14, 12' and 14' is made plano to simplify manufacturing and eliminate surface displacement errors. Furthermore, a plano rear surface can be placed close to an optical recording medium, facilitating evanescent coupling to the optical recording medium and ensuring its uniformity.

Figure 7:
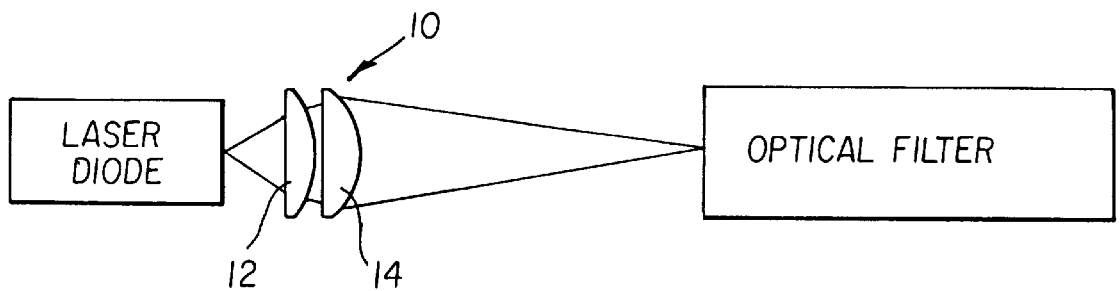
FIG. 7 is a schematic illustration of an optical system that utilizes the high numerical aperture objective lens of FIG. 2. The objective lens is used for coupling a laser diode to an optical fiber.
Figure 8:
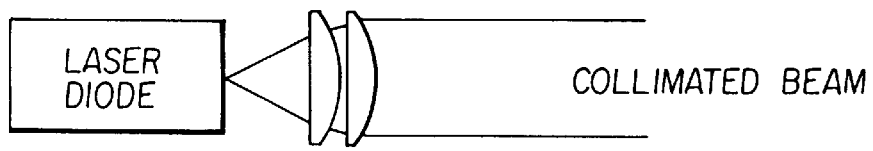
FIG. 8 schematically depicts a high numerical aperture objective lens used as a laser diode collimator.
Figure 9:
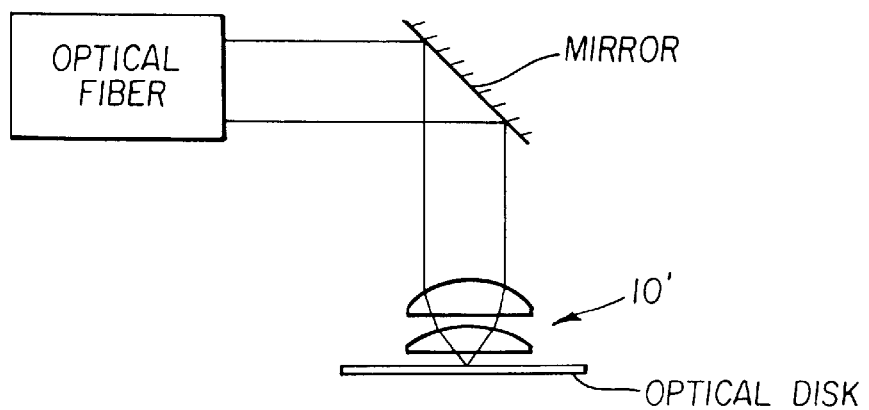
FIG. 9 schematically illustrates a laser disk writer utilizing the high numerical aperture objective lens of FIG. 5.

FIGS. 7, 8, and 9 illustrate some of the uses of the high numerical aperture objective lenses of the present invention. More specifically, FIG. 7 illustrates an optical system that utilizes the high numerical aperture objective lens 10 for coupling a laser diode to an optical fiber. FIG. 8 depicts a high numerical aperture objective lens as a laser diode collimator. FIG. 9 illustrates a laser disk writer utilizing the high numerical aperture objective lens 10'.

The invention has been described in detail with particular reference to certain preferred embodiments thereof, but it will be understood that variations and modifications can be effected within the spirit and scope of the invention.

What is claimed is:

1. A high numerical aperture objective lens for focusing a laser beam, said objective lens consisting of:

a first lens element of positive optical power intercepting said laser beam; and a second lens element of positive optical power located adjacent to said first lens element, wherein said first lens element and said second lens element have identical surface profiles, further wherein said first and said second lens elements, in combination, provide said objective lens with a numerical aperture greater than 1.

2. A high numerical aperture objective lens for focusing a laser beam, said objective lens consisting of:

a first lens element of positive optical power intercepting said laser beam; and a second lens element of positive optical power located adjacent to said first lens element, wherein said first lens element and said second lens element have identical surface profiles, wherein each of said lens elements has at least one aspheric surface, further wherein said surfaces are characterized with aspheric coefficients, at least one of which aspheric coefficients has an exponent greater than 1.

3. A high numerical aperture objective lens for focusing a laser beam, said objective lens consisting of:

a first lens element of positive optical power intercepting said laser beam; and a second lens element of positive optical power located adjacent to said first lens element, wherein said first lens element and said second lens element have identical surface profiles, wherein each of said lens elements has at least one aspheric surface, further wherein said surfaces are characterized with aspheric coefficients and each of said aspheric coefficients has an exponent greater than 1.

4. An objective lens according to claim 2, wherein said lens elements have clear aperture diameters that are less than 1 mm.

5. An objective lens according to claim 3, wherein said lens elements have clear aperture diameters that are less than 1 mm.

6. A high numerical aperture objective lens for collimating a diverging laser beam, said high numerical aperture objective lens consisting of:

a first lens element of positive optical power intercepting said diverging laser beam, said first lens element being characterized by a having a thickness and radii of curvature; and a second lens element of positive optical power located adjacent to said first lens element, said second lens element having a thickness and radii of curvature that are identical to said thickness and radii of curvature of said first lens element, said first and second lens elements, in combination, providing sufficient optical power to collimate said diverging light beam.

7. An optical system consisting of:

a light source providing a diverging laser beam;

a first lens element of positive optical power intercepting said laser beam, said first lens element being characterized by having a thickness and radii of curvature; and a second lens element of positive optical power located adjacent to said first lens element, said second lens element having a thickness and radii of curvature that are identical to said thickness and radii of curvature of said first lens element, wherein said first lens element and said second lens element, in combination, having sufficient optical power to collimate said diverging laser beam.

8. An optical system according to claim 7, wherein said source is a laser diode.

9. An optical system according to claim 8, wherein said second lens clement is identical to said first lens element.

10. An optical system according to claim 9, wherein each of said lens elements has a plano surface and a convex surface.

11. An optical system according to claim 10, wherein said convex surface is aspheric.

12. An optical system according to claim 8, wherein each of said lens elements has at least one convex surface, said convex surface being an aspheric surface.

13. An optical system according to claim 11, wherein said aspheric surface is characterized by aspheric coefficients and at least one of said aspheric coefficients has an exponent that is greater than 1.

14. An optical system according to claim 13, wherein said lens elements have clear aperture diameters that are less than 1 mm.

15. An optical system according to claim 7, wherein said first and said second lens elements have an index of refraction greater than 1.7.

16. An objective lens for converging a diverging light beam, comprising:

a first convex-plano lens element located along an optical axis and a second convex-plano lens element located along the optical axis closer to a converging part of the beam than to a diverging part of the beam with respect to the first lens element, wherein the first and second lens elements have identical surface profiles, further wherein the first and second lens elements are positioned relative to each other such that the convex surface of the second lens element is adjacent the plano surface of the first lens element.

17. The objective lens according to claim 16, wherein said first and said second lens elements, in combination, provide said objective lens with a numerical aperture greater than 0.70.

18. The objective lens according to claim 16, wherein said first and second lens elements have identical thicknesses.

19. The objective lens according to claim 18, wherein said first and said second lens elements, in combination, provide said objective lens with a numerical aperture greater than 0.83.

20. The objective lens according to claim 18, wherein said first and said second lens elements, in combination, provide said objective lens with a numerical aperture greater than 1.

21. The objective lens according to claim 17, wherein each of said lens elements have at least one aspheric surface.

22. The objective lens according to claim 21, wherein said surfaces are characterized with aspheric coefficients, at least one of which aspheric coefficients has an exponent greater than 1.

23. The objective lens according to claim 21, wherein said surfaces are characterized with aspheric coefficients and each of said aspheric coefficients has an exponent greater than 1.

24. The objective lens according to claim 21, wherein said lens elements have clear aperture diameters that are less than 1 mm.

25. A method of coupling a light beam to a light sensitive medium, comprising the steps of:

providing a diverging light source object;

propagating said diverging light source object through a first convex-plano lens element located along an optical axis;

locating a second convex-plano lens element that is identical to the first convex-plano lens element along the optical axis in such a manner that the convex surface of the second lens element is adjacent the plano surface of the first lens element; and propagating light from said diverging light source object through said second lens element to form an image of said object on an image plane.

26. The method of claim 25, wherein said image plane is located a finite distance from the plano surface of the second lens element.

27. The method of claim 25, wherein said image plane is located at the plano surface of the second lens element.

28. The method of claim 25, wherein said light beam is a laser beam.

29. The method of claim 25, wherein said light sensitive medium is one of an optical reading and an optical recording medium.

* * * * *